United States Patent [19]
Maeda et al.

[11] 3,837,935
[45] Sept. 24, 1974

[54] SEMICONDUCTOR DEVICES AND METHOD OF MANUFACTURING THE SAME

[75] Inventors: Kazuo Maeda, Chigaski; Kazunari Shirai, Yokohama, both of Japan

[73] Assignee: Fujitsu Limited, Kawasaki, Japan

[22] Filed: May 25, 1972

[21] Appl. No.: 256,753

[30] Foreign Application Priority Data

May 28, 1971 Japan .................................. 46-3675
Aug. 12, 1971 Japan ................................ 46-61134

[52] U.S. Cl. .............. 148/187, 148/189, 317/235 R
[51] Int. Cl. .............................................. H01l 7/34
[58] Field of Search ...... 317/235 B, 235 AT, 235 R; 148/187

[56] References Cited

UNITED STATES PATENTS

| | | | |
|---|---|---|---|
| 3,570,114 | 3/1971 | Bean | 29/577 |
| 3,646,665 | 3/1972 | Kim | 29/571 |
| 3,664,896 | 5/1972 | Duncan | 148/187 |
| 3,699,646 | 10/1972 | Vadasz | 29/571 |

*Primary Examiner*—L. Dewayne Rutledge
*Assistant Examiner*—J. M. Davis
*Attorney, Agent, or Firm*—Herbert L. Lerner

[57] ABSTRACT

A semiconductor device wherein a polycrystalline silicon layer, conductively in contact with a source region and a drain region and having impurities of the same conductivity type as that of said source region and said drain region, is the lead out electrode of said source region and said drain region. The method of forming said semiconductor devices is also disclosed.

3 Claims, 17 Drawing Figures

SEMICONDUCTOR DEVICES AND METHOD OF MANUFACTURING THE SAME

The present invention relates to semiconductor devices and the method of manufacturing the same. In particular, the invention provides a new construction of the field effect transistor called "Metal Oxide semiconductor transistor" (MOS Tr), and a method of manfacturing the same.

Various proposals and a lot of improvements have been made with respect to the field effect transistor of this type.

The invention will be described with respect to the drawings wherein.

For example, it was proposed to use polycrystalline silicon in gate electrodes for the means to prevent the inversion phenomena. It was intended to minimize, as far as possible, the differences between the work functions of semiconductor substrates in which the source regions and drain regions are formed and those of the gate electrodes.

Figure 1:
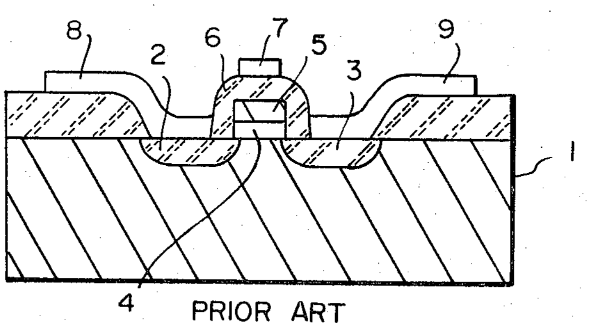
FIG. 1 shows, in cross-sectional view a conventional semiconductor device.

FIG. 1 shows the construction of the above-mentioned field effect transistor. In this type field effect transistor one sees a semiconductor substrate 1, a source region 2 in the semiconductor substrate 1, a drain region 3 spaced from the source region 2, a silicon dioxide film 4 on the surface of the semiconductor substrate 1, and a gate electrode 5 consisting of polycrystalline silicon on the surface of the silicon dioxide film 4, situated between the source region 2 and drain region 3. The gate electrode 5 is coated with a insulation layer 6. Wiring layers 7, 8 and 9 lead respectively to each electrode.

Such an FET is manufactured as follows: A silicon dioxide film is first formed on the surface of a Single-crystalline semiconductor substrate. A polycrystalline silicon layer is then formed on the surface of the silicon dioxide film. Selected portions of the polycrystalline silicon layer are removed in order to form apertures or windows through which the silicon dioxide film is exposed. The exposed portions of the silicon dioxide film is removed to form apertures in the silicon dioxide film. Impurities are then diffused through said apertures to form the source region 2 and the drain region 3 in the semiconductor substrate 1.

This construction and manufacturing method can reduce the production steps and provide highly integrated circuits while preventing inversion phenomena mentioned above. That is to say, it is not required to prepare masks necessary for opening windows in said source region and drain region and align them, since the windows can be opened in the source region and drain region by masking polycrystalline silicon for the gate electrode. In addition, since the gate electrode is covered with the insulation layer, it is easy to obtain a multilayer construction.

The construction and manufacturing method therefore having such features, however, still has the following disadvantages:

Since the formation of the source region and the drain region and the leading out of the electrode rely upon conventional steps, it requires relatively large surface area per device and it is difficult to improve the degree of the integration. In addition, adverse effects are seen at the interface between the polycrystalline silicon and the silicon dioxide film by the impurity diffusion that forms the source region and drain region, which render the threshold voltage (Vth) high. Impurities are diffused into the polycrystalline silicon in the diffusion processing and it is difficult to control.

Semiconductor devices of this type may some times employ silicon nitride, aluminum oxide, etc. as a passivation film (not shown) to prevent the intrusion of $Na^+$ and the like from the outside. However, such silicon nitride and aluminum oxide layers are crystallized in a succeeding heat treatment to change the nature of the film. This crystallization reduces the intended passivation effects. The film nature of silicon nitride and of aluminum oxide generally changes at a temperature above 850°C.

Moreover, polycrystalline silicon, which is a gate electrode, contains impurities in the formation of the source region and drain region. It is opposite to the conduction type of the semiconductor substrate and undesirable, especially for the formation of FET of N channel type.

The present invention has among its objects to obviate such disadvantages as are encountered in the usual devices. It is an object of the present invention to obtain semiconductor devices with higher integration and to provide novel means for the construction and manufacturing method thereof. It is another object of the present invention to obtain more stabilized semiconductor devices and to provide novel means for the construction and manufacturing method thereof.

In order to achieve the foregoing purposes, the present invention provides a method for manufacturing semiconductor devices by:

forming an insulation film which has a window for diffusion on a semiconductor substrate; forming a polycrystalline silicon film, which covers said insulation film and the surface of said semiconductor substrate exposed through said window for diffusion and has impurities doped therein; forming a silicon dioxide film over said polycrystalline film; forming a window in said silicon dioxide film and said polycrystalline film; applying heat to form a source region and a drain region in said substrate; whereby the impurities contained in the polycrystalline silicon layer diffuse therefrom by said heat treatment to the silicon substrate to form two regions which have conduction type contrary to that of said silicon substrate, that is, the source region and the drain region, and define the length of a conduction channel between said source region and drain region.

The present invention will be described more fully with reference to the production steps as shown in the drawings.

FIGS. 2 to 16 show, in cross-sectional view, the production steps for producing a FET device according to one example of the invention.

A P channel type MOS transistor is shown by way of the example for FET.

An insulation film 102 consisted of silicon dioxide ($SiO_2$) is at first formed on a surface of N type silicon substrate 101 which, for example, has a specific resistance 10Ωcm. The insulation film can be formed through the conventional heat oxidation method. The silicon dioxide film 102 is then thickened, for example, approximately to 1μ. This can be formed by either the heat oxidation method or by gas phase reaction of monosililane ($SiH_4$) with oxygen ($O_2$) etc. to produce the device shown in FIG. 2.

Figure 3:
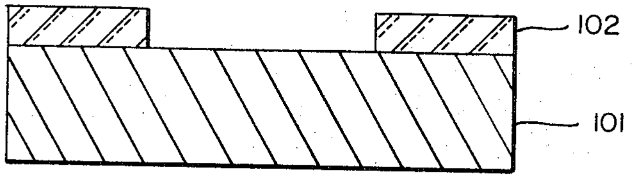

The silicon dioxide film 102 is then removed at desired region areas to expose the surface of the silicon substrate. The silicon dioxide film 102 is selectively removed by the conventional photo-etching method as is seen in FIG. 3.

A polycrystalline silicon layer 103, which contains impurities of conduction type contrary to that of the silicon substrate, i.e., P type, is then formed with the specific resistance of 0.01Ωcm (ohm centimeter) to a thickness of about 6,000 A. This layer covers both the silicon dioxide film 102 and the exposed silicon substrate.

Boron is a suitable P type impurity. Boron is supplied in the form of diborane ($B_2H_6$) together with hydrogen ($H_2$), argon (Ar) and oxygen ($O_2$) and included in the polycrystalline silicon layer 103. The polycrystalline silicon layer 103, on the other hand, is formed, for example, by pyrolysis of monosilane.

Figure 4:
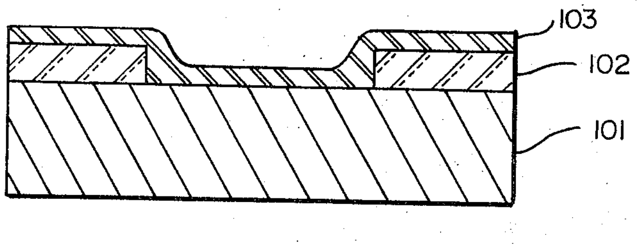

Although monosilane can be decomposed at about 300°C, it is desirable to decompose it at about 600°C because of operation efficiency and film quality of the polycrystalline silicon layer 103 to be formed. This is shown in FIG. 4.

Figure 5:
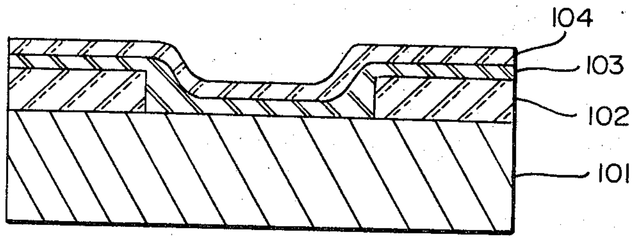

As seen in FIG. 5, an approximately 2,000 A. thick silicon dioxide layer 104 is formed, and covers the polycrystalline silicon layer 103.

The $SiO_2$ layer is also formed by the gas phase reaction of monosilane ($SiH_4$) with oxygen ($O_2$).

Figure 6:
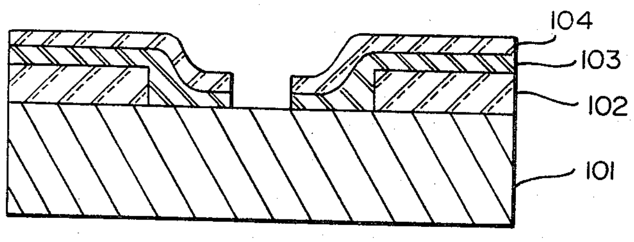

A window is opened in silicon layer 103, which is directly attached to and formed on the surface of the silicon substrate 101, and the silicon dioxide layer 104 which covers the polycrystalline silicon to again expose substrate 101. The polycrystalline silicon layer 103 and silicon dioxide layer 104 can both be selectively removed by the conventional photo-etching method. A hydrofluoric acid etching liquid system can be used for the upper silicon dioxide layer 104 while a nitric acid — glacial acetic acid — hydrofluoric acid etching liquid system can be used for the lower polycrystalline silicon layer. The etched body is shown in FIG. 6.

Figure 7:
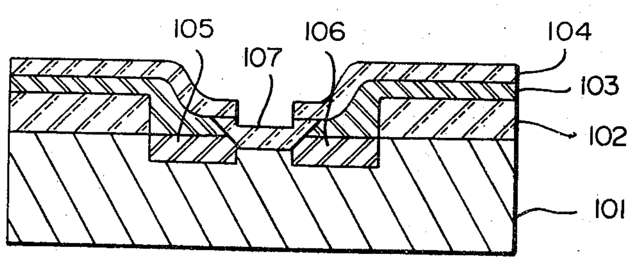

The surface of the exposed silicon substrate 101 is situated directly below the gate electrode formed by the succeeding step. A heat treatment is applied for the formation of a source region 105 and a drain region 106 and of an oxide film 107 directly below the gate electrode. This heat treatment is performed under an oxidative atmosphere, for example, oxygen atmosphere, at a temperature, for example of 1,200°C for 30 minutes. The surface of the exposed silicon substrate 101 is oxidized by the heat treatment to form a silicon dioxide film 107 of about 1,500 A. thickness. At the same time, the impurities contained in the polycrystalline silicon layer 103 diffuse therefrom by said heat treatment to the silicon substrate 101 to form two regions which have conduction type contrary to that of said silicon substrate 101, that is, the source region 105 and the drain region 106. The source region 105 and the drain region 106 are 23μ deep with 400Ω/□ specific resistivity under the conditions of the heat treatment. This is seen in FIG. 7.

Figure 8:
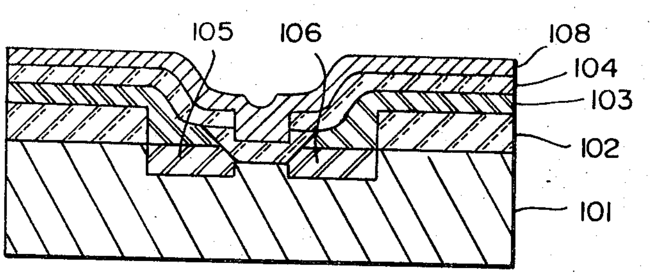
PRIOR ART FIG. 8
FIG. 2 to FIG. 12 show, in cross-sectional view, the production steps in a first example for the method of manufacturing semiconductor devices according to the present invention.

A passivation film 108, approximately 1μ thick, covering said silicon substrate 101, is then formed. The passivation film 108 can, for example, be silicon nitride ($Si_2N_4$), aluminum oxide ($Al_2O_3$) and the like. The passivation film 108 prevents stain from the outside. Silicon nitride can be synthesized from gas phase reaction of gaseous ammonia with monosilane at a temperature, for example, of 900° to 1000°C. Aluminum oxide can be formed by pyrolysis of aluminum hexafluoroacetylacetonate Al $(HFA)_3$, aluminum tri-fluoro-acetylacetonate $Al(FA)_3$ with oxygen. This layer is shown in FIG. 8.

Figure 9:
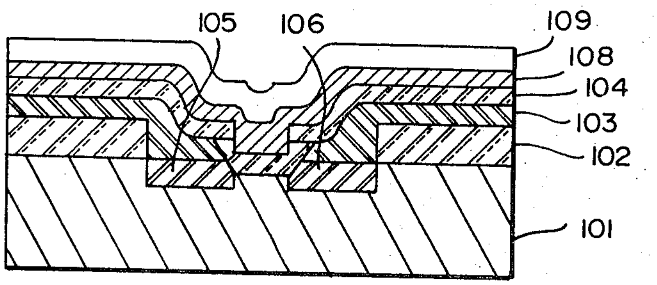

Aluminum or polycrystalline silicone 109, approximately 1 – 1.5μ thick is then deposited and covers the passivation film 108. Vapor deposition can be used for aluminum deposition and pyrolysis of monosilane for polycrystalline silicon deposition. This is shown in FIG. 9.

Figure 10:
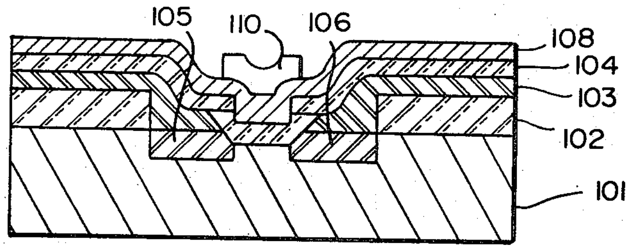

The aluminum or polycrystalline silicon is then removed by the conventional photo-etching method leaving the portion which is situated directly above the oxide film 107. The aluminum or polycrystalline silicon left behind is used as the gate electrode 110 and is seen in FIG. 10.

Figure 11:
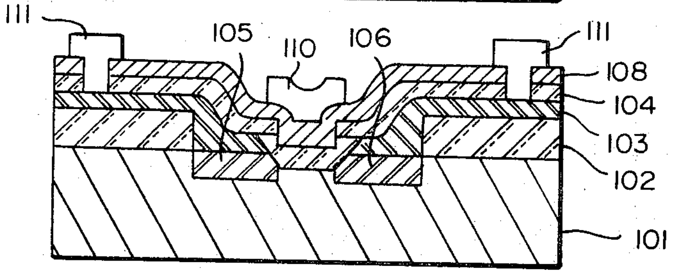

An electrode 111 to the polycrystalline silicon layer 103, which extensively covers the silicon dioxide film 102 is then formed. The electrode 111 is formed by first forming an aperture which passes through both the silicon dioxide film and the passivation film, covering the polycrystalline silicon layer by conventional photo-etching method. Aluminum is vapor deposited on the aperture and the unnecessary portions then selectively removed. This is seen in FIG. 11.

It is, of course, possible to form the gate electrode, the source electrode and the drain electrode simultaneously. In such a case, aluminum is deposited to all over the surfaces after the formation of the apertures.

Through the steps described above, a FET device is formed.

Figure 12:
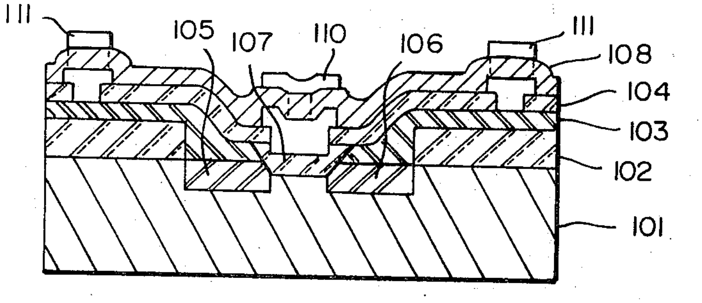
Figure 2:
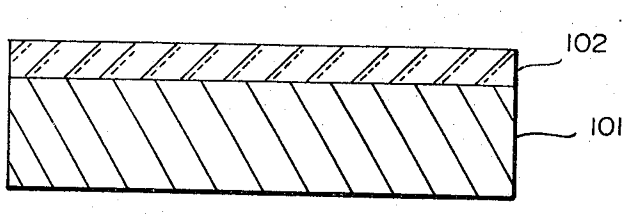

The foregoing steps can be modified as follows: The silicon dioxide film 107 is first formed. Thereafter, gate electrode 100 is formed directly on the dioxide film 107. The passivation film 108 is then formed covering also said gate electrode 100. The gate electrode 100 is then to lead to the other surface. FIG. 12 shows the construction of said FET device.

FIG. 13 to FIG. 16 show the steps in another embodiment according to the present invention, wherein a P channel type MOS transistor, for example, is obtained. A silicon dioxide insulation film 202 is formed, for example, on an N type silicon substrate 201 having a specific resistivity of 10Ωcm. The $SiO_2$ insulation layer 202 can be grown to an approximate thickness of 1μ by the conventional heat oxidation method or by a gas phase reaction of monosilane with oxygen. It is also possible to form a further insulation layer of $Si_3N_4$ etc. The $SiO_2$ insulation layer in the transistor device region is removed partially by the photo-etching treatment in order to open a window exposing the surface of the silicon substrate 201.

Figure 13:
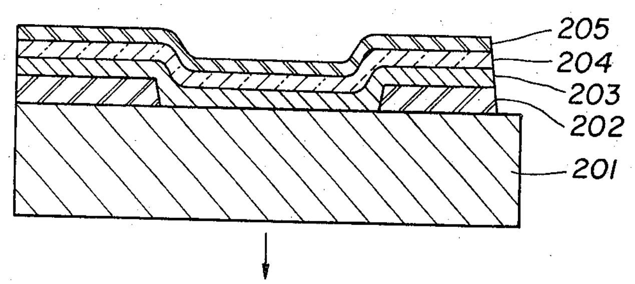
FIG. 13 to FIG. 16 show, in cross-sectional view, the production steps in a second example for the method of manufacturing semiconductor devices according to the present invention.

After that, the polycrystalline silicon layer 203, which does not contain impurities and is approximately 5,000 A. thick, is formed over the entire surface and a borosilicate glass layer 204 is further formed approximately to 5,000 A. thick. Boron, contained in this borosilicate glass layer 204, is utilized for the diffusion and on $SiO_2$ insulation layer 205, is grown to approximately 2,000 A. thickness so that said boron does not diffuse outwardly. This is shown in FIG. 13.

Figure 14:
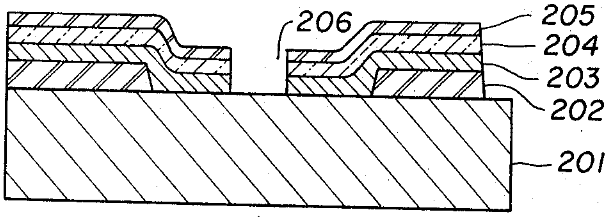

A window 206 is then opened in the $SiO_2$ insulation layer 205, borosilicate glass layer 204 and the polycrystalline silicon layer 203 by the conventional photoetching techniques, so as to expose the silicon substrate 201 with a desired surface area. A hydrofluoric acid system etching liquid can be used for the upper $SiO_2$ insulation layer 205. A nitric acid — glacial acetic acid — hydrofluoric acid system etching system can be used, for example, for the borosilicate glass layer 204. This is shown in FIG. 14.

A heat treatment is then carried out to form the source region 207 and drain region 208 and to form the insulation layer 209 directly below the gate electrode. This heat treatment is performed in an oxidative atmosphere, for example of 1,200°C for about 30 minutes.

Figure 15:
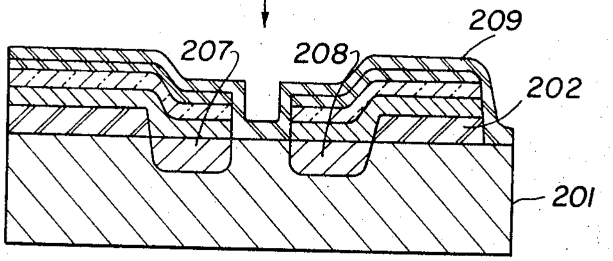

During the heat treatment, boron contained in the borosilicate glass layer 204 diffuses into the polycrystalline layer 203 and from the polycrystalline silicon layer 203, adjacent to the silicon substrate 201, further diffuses into the silicon substrate 201 to form the P type source region 207 and drain region 208. The diffusion, in this case, proceeds in the vertical direction only and not in transverse direction. Accordingly, the impurities neither diffuse to the portion directly below the window 206 nor to the $SiO_2$ insulation 202. This is shown in FIG. 15.

If required, a passivation film 209 is then formed over the entire surface. $Si_3N_4$ and $Al_2O_3$ etc. are suitable for the passivation film, $Si_3N_4$, for example, is formed by gas phase reaction of $NH_3$ and $SiH_4$ at a temperature of 900° – 1,000° C, while $Al_2O_3$ is formed by the pyrolysis of aluminum hexafluoro acetylacetonate $Al(HFA)_3$, aluminum trifluoro acetylacetonate $Al(TFA)_3$, or aluminum acetylacetonate $Al(AA)_3$ with oxygen.

Aluminum or polycrystalline silicon is then formed over the surface in a layer approximately 1 – 1.5$\mu$ thick by vapor deposition or by the pyrolysis of monosilane. It is removed partially by photo-etching leaving the portion behind corresponding to the window 206 to form gate electrode 210.

A window is then opened to reach the polycrystalline layer 203. Aluminum or polycrystalline silicon is vapor deposited and selectively removed to form the source electrode 211 and the drain electrode 212. The source electrode 211 and the drain electrode 212 can be formed simultaneously with the gate electrode 210. In this case, it can be done by the opening of the window which reaches the polycrystalline silicon layer 203, depositing the aluminum over all the surface and removing the excess aluminum.

Figure 16:
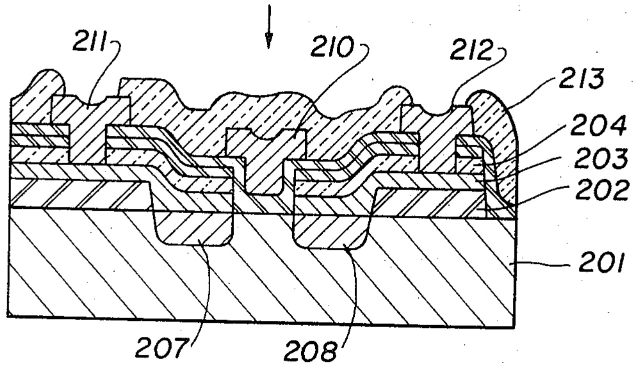

The phosphosilicate glass layer 213 is formed to all over the surface, the window is opened for the leading out of the electrodes to thereby complete the MOS transistor shown in FIG. 16.

The foregoing examples are described in the case of the P type channel. In the case of the N type channel, a phosphosilicate glass layer, for example, which contains N type impurities is provided instead of the borosilicate glass layer 204. The phosphorus contained therein is diffused by way of the polycrystalline silicon layer 203 into the P type silicon substrate 201.

According to this invention, the following effects are obtainable. First, polycrystalline silicon with the impurities can be used for diffusing the impurties when a source region and a drain region are formed.

The extended portion can be utilized for the connecting terminal to external part of the source region and the drain region. In this case, the impurity diffusion coefficient is different between the polycrystalline silicon layer and the monocrystalline silicon substrate. The diffusion coefficient of the polycrystalline silicon is larger than that of the monocrystalline silicon. Therefore, the impurities concentration at the interface, that is the surface concentration of the monocrystalline silicon substrate can be kept almost constant.

In addition, the area required for a device can be reduced not only because the polycrystalline silicon is assumed to be conductive layer, but also because the integration density in the semiconductor chip can be increased. These facts also show that the diffusion of the impurities from the polycrystalline silicon is only in the vertical direction and not in the horizontal direction.

Molybdenum can be also used for the gate electrode as well as aluminum or silicon mentioned hereinbefore.

Phosphosilicate glass (PSG), etc. can be used for the passivation film, as well as silicon nitride and aluminum oxide mentioned earlier. In this case, these chemicals are not subjected to the heat treatment at high temperature after forming the film and therefore, they can be used in a stable state.

In addition, the side view of the gate is not likely to get dirty.

Figure 17:
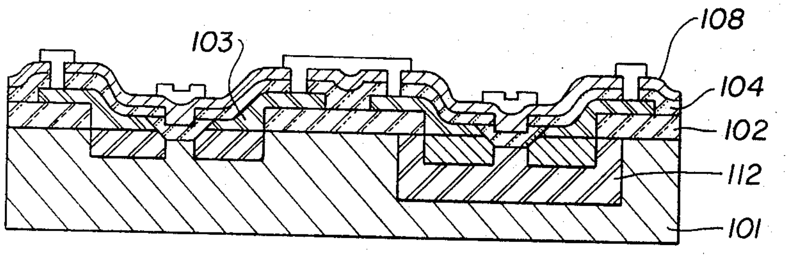
FIG. 17 shows, in cross-sectional view, a semiconductor device formed by a third example for the method of manufacturing the same according to the present invention.

In addition of a few steps easily provide a field effect transistor of a complementary type shown in FIG. 17. In addition to the first specific example, P type impurity diffusion area 112 is formed in an N type silicon substrate. The impurity is then diffused from the polycrystalline silicon including either P type or N type impurity into the silicon substrate 101. At this time, P channel and N channel areas are simultaneously formed. The respective source regions are coupled with the drain region electrically to form a complementary field effect transistor.

In the second specific example, a borosilicate glass layer is formed at the P channel type area, while a phosphosilicate glass layer is formed at the N channel area. At this time, diffusion and reoxidation are carried out simultaneously resulting in manufacturing a complementary field effect transistor with ease.

We claim:

1. A method for manufacturing semiconductor devices which comprises:

forming an insulation film which has a window for diffusion on a semiconductor substrate, forming a polycrystalline silicon film, which covers said insulation film and the surface of said semiconductor substrate exposed through said window for diffusion and has impurities doped therein, forming a silicon dioxide film over said polycrystalline film, forming a window in said silicon dioxide film and said polycrystalline film, applying heat to form a source region and a drain region in said substrate, whereby the impurities contained in said polycrystalline silicon layer diffuse therefrom by said heat treatment to the silicon substrate to form two regions which have conduction type contrary to that of said silicon substrate, namely, the source region and the drain region, and define the length of a conduction channel between said source region and drain region, applying a passivation film on top of said assembly, applying one of the group comprising aluminum or polycrystalline silicon on top of said passivation film, selectively removing said last film and leaving a central portion thereof to form a gate electrode, and attaching two electrodes to said polycrystalline layer.

2. A method of manufacturing semiconductor devices comprising:

forming an insulation film which has a window for diffusion onto a semiconductor substrate, forming a polycrystal silicon film which does not contain impurities, and which covers said insulation film and the surface of said semiconductor substrate exposed through said window, forming a borosilicate glass film which contains impurities covering said polycrystal silicon film, forming a silicon dioxide film, forming a window in all said films to expose the substrate with a desired surface area, heat treating said assembly to form a source region and a drain region in said substrate and to form said insulation layer directly below the central gate electrode so that boron contained in the borosilicate glass layer diffuses into the polycrystalline layer and from the polycrystalline silicon layer, adjacent to the silicon substrate, further diffuses into the silicon substrate to form the P type source region and drain region, the diffusion, in this case, proceeding in the vertical direction only and not in transverse direction, whereby, the impurities neither diffuse to the portion directly below the window nor to the silicon dioxide insulation, a passivation film is then formed over the entire surface, a film of one of the group comprising aluminum and polycrystalline silicon is then formed over the surface, said last film is removed partially by photo etching leaving a portion behind to form a gate electrode, a window is then opened to reach said polycrystalline layer, a film of one of the groups comprising aluminum and polycrystalline silicon is vapor deposited and selectively removed to form the source electrode and the drain electrode.

3. The method as in claim 1 which comprises, forming of a silicon dioxide film on said substrate and forming said gate electrode on said silicon dioxide film.

* * * * *

F-5655

UNITED STATES PATENT OFFICE

CERTIFICATE OF CORRECTION

Patent No. 3,837,935 Dated September 24, 1974

Inventor(s) KAZUO MAEDA and KAZUNARI SHIRAI

It is certified that error appears in the above-identified patent and that said Letters Patent are hereby corrected as shown below:

In the heading to the printed specification, line 10,

"May 28, 1971 Japan..........46-3675" should read

--May 28, 1971 Japan..........46-36754--

Signed and sealed this 31st day of December 1974.

(SEAL)
Attest:

McCOY M. GIBSON JR.
Attesting Officer

C. MARSHALL DANN
Commissioner of Patents